(12) United States Patent
Izuha

(10) Patent No.: US 8,691,601 B2
(45) Date of Patent: Apr. 8, 2014

(54) SEMICONDUCTOR DEVICE AND PENETRATING ELECTRODE TESTING METHOD

(75) Inventor: Mitsuaki Izuha, Kanagawa (JP)

(73) Assignee: Sony Corporation, Tokyo (JP)

( * ) Notice: Subject to any disclaimer, the term of this patent is extended or adjusted under 35 U.S.C. 154(b) by 294 days.

(21) Appl. No.: 12/926,879

(22) Filed: Dec. 15, 2010

(65) Prior Publication Data

US 2011/0204357 A1   Aug. 25, 2011

(30) Foreign Application Priority Data

Feb. 19, 2010   (JP) ................................. 2010-035350

(51) Int. Cl.
*G01R 31/26* (2006.01)

(52) U.S. Cl.
USPC ................................... 438/18; 257/E21.531

(58) Field of Classification Search
USPC ............. 257/48, E21.521, E23.002, E21.523, 257/E21.531, E21.529; 438/14, 17, 18
See application file for complete search history.

(56) References Cited

U.S. PATENT DOCUMENTS

| | | | |
|---|---|---|---|
| 6,235,624 B1 * | 5/2001 | Sasaki et al. | 438/618 |
| 6,468,889 B1 * | 10/2002 | Iacoponi et al. | 438/597 |
| 6,479,382 B1 * | 11/2002 | Naem | 438/658 |
| 6,620,731 B1 * | 9/2003 | Farnworth et al. | 438/667 |
| 6,872,583 B1 * | 3/2005 | Wu | 438/18 |
| 7,215,032 B2 * | 5/2007 | Trezza | 257/774 |
| 7,345,350 B2 * | 3/2008 | Sinha | 257/449 |
| 7,541,203 B1 * | 6/2009 | Knickerbocker | 438/17 |
| 7,973,310 B2 * | 7/2011 | Wang et al. | 257/48 |
| 8,101,496 B2 * | 1/2012 | Takao | 438/406 |
| 2002/0115290 A1 * | 8/2002 | Halahan et al. | 438/667 |
| 2002/0180026 A1 * | 12/2002 | Liu et al. | 257/692 |
| 2003/0082356 A1 * | 5/2003 | Suemasu et al. | 428/209 |
| 2005/0003649 A1 * | 1/2005 | Takao | 438/612 |
| 2005/0064707 A1 * | 3/2005 | Sinha | 438/667 |
| 2006/0040471 A1 * | 2/2006 | Ramanathan et al. | 438/459 |
| 2006/0051949 A1 * | 3/2006 | Nemoto | 438/597 |
| 2007/0221920 A1 * | 9/2007 | Mardi et al. | 257/48 |
| 2008/0224322 A1 * | 9/2008 | Shinogi | 257/777 |
| 2009/0032951 A1 * | 2/2009 | Andry et al. | 257/751 |
| 2009/0153177 A1 * | 6/2009 | Shibata | 324/765 |
| 2009/0194864 A1 * | 8/2009 | Dang et al. | 257/691 |
| 2010/0062565 A1 * | 3/2010 | Martin et al. | 438/107 |

(Continued)

FOREIGN PATENT DOCUMENTS

JP   2008-096312   4/2008

OTHER PUBLICATIONS

Tezcan et al. "Sloped Through Wafer Vias for 3D Wafer Level Packaging," 2007, 2007 Electronic Components and Technology Conference, pp. 643-647.*

*Primary Examiner* — William F Kraig
*Assistant Examiner* — Joseph C Nicely
(74) *Attorney, Agent, or Firm* — Rader, Fishman & Grauer PLLC

(57) ABSTRACT

Disclosed herein is a semiconductor device, including: a semiconductor substrate; an integrated circuit formed on a first main surface of the semiconductor substrate; a penetrating electrode that penetrates the semiconductor substrate in the thickness direction and has its one end electrically connected to the integrated circuit; a bump electrode formed on a second main surface of the semiconductor substrate and electrically connected to another end of the penetrating electrode; and a test pad electrode formed on the second main surface of the semiconductor substrate and electrically connected to the bump electrode.

20 Claims, 5 Drawing Sheets

(56) References Cited

U.S. PATENT DOCUMENTS

| | | | |
|---|---|---|---|
| 2010/0326702 A1* | 12/2010 | Dang et al. .................... | 174/250 |
| 2011/0049515 A1* | 3/2011 | Kuo et al. ...................... | 257/48 |
| 2011/0057677 A1* | 3/2011 | Black et al. ............... | 324/756.01 |
| 2012/0040509 A1* | 2/2012 | Kim et al. ..................... | 438/382 |
| 2012/0074541 A1* | 3/2012 | Ito et al. ........................ | 257/659 |
| 2012/0091582 A1* | 4/2012 | Oganesian et al. ........... | 257/737 |
| 2012/0105089 A1* | 5/2012 | Song et al. ................ | 324/755.05 |
| 2012/0187570 A1* | 7/2012 | Bartley et al. ................. | 257/774 |
| 2012/0249173 A1* | 10/2012 | Hamel et al. ............. | 324/755.01 |
| 2013/0011968 A1* | 1/2013 | Bartley et al. ................. | 438/109 |

* cited by examiner

<COMPARATIVE EXAMPLE>

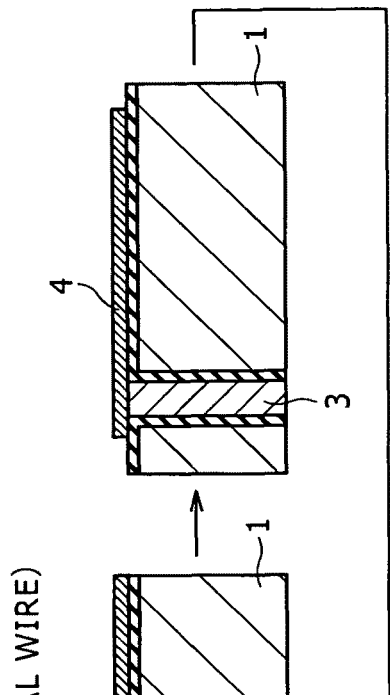
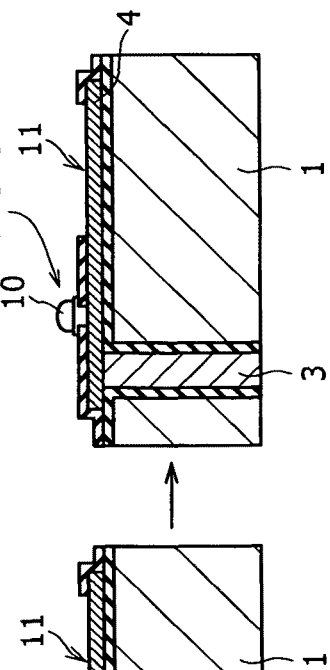
FIG.3A FIG.3B FIG.3C
FIG.3D FIG.3E FIG.3F

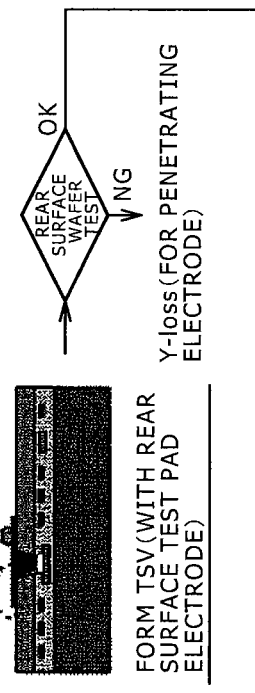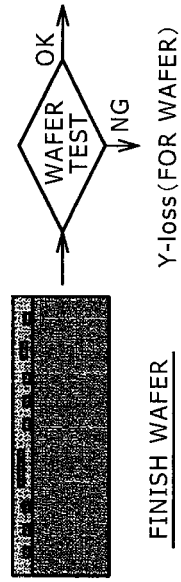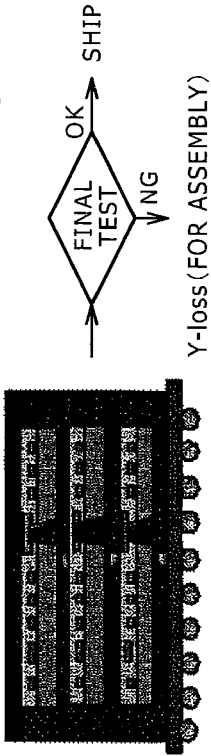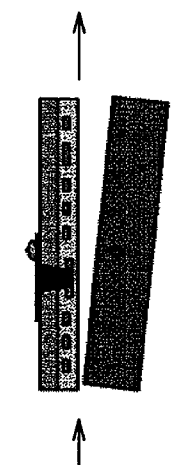
FIG.4A  FIG.4B  FIG.4C  FIG.4D  FIG.4E  FIG.4F  FIG.4G

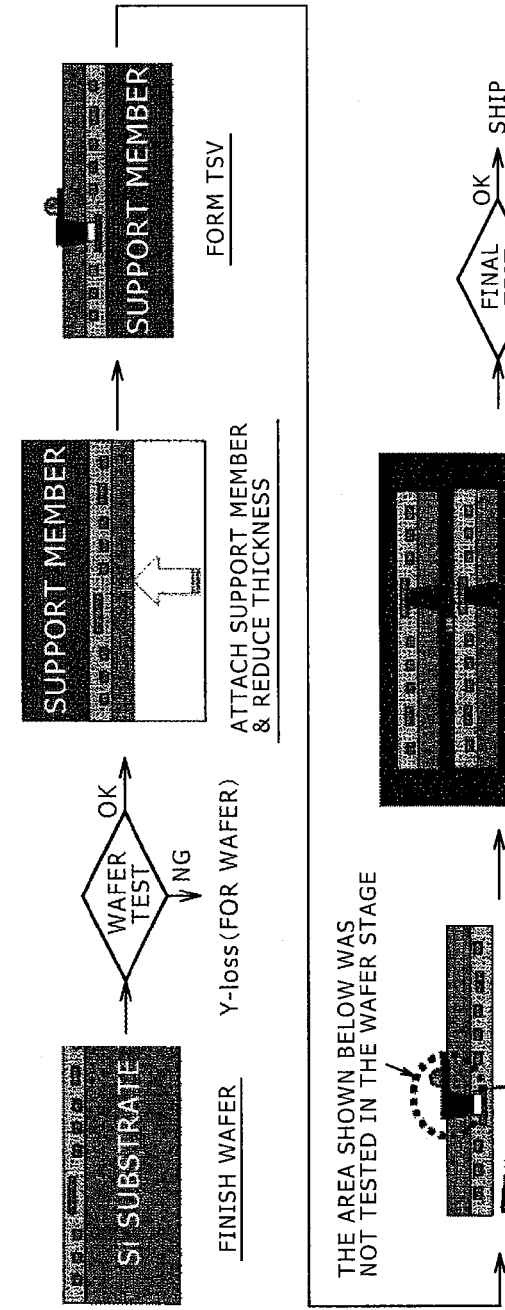

SEMICONDUCTOR DEVICE AND PENETRATING ELECTRODE TESTING METHOD

BACKGROUND OF THE INVENTION

1. Field of the Invention

The present invention relates to a semiconductor device in which an integrated circuit is formed on one main surface (e.g., front surface), in which a bump electrode is formed on another main surface (e.g., rear surface) that is on the opposite side of the one main surface with a semiconductor substrate sandwiched therebetween, and in which a penetrating electrode adapted to electrically connect the bump electrode and integrated circuit is formed in such a manner as to penetrate the semiconductor substrate in the thickness direction. The present invention also relates to a penetrating electrode testing method for electrically testing such a penetrating electrode for connection at both ends thereof.

2. Description of the Related Art

The three-dimensional integration technique is known that is designed to stack a plurality of semiconductor substrates, each having an integrated circuit formed thereon, one on top of another. The progress of this technique owes much to the technical development of a contact pressure type microprotruding electrode called microbump, the formation technique of a penetrating electrode that penetrates a semiconductor in the thickness direction, the reduction in thickness of semiconductors and the progress of handling and other techniques.

In order to form a three-dimensional integrated circuit, chips, each having an integrated circuit formed on its front surface and bump electrode formed on its rear surface, are generally stacked one on top of another on a semiconductor substrate serving as a mother substrate. At this time, it is known to mount, for example, a boundary scan test circuit to ensure connection between a bump electrode and pad and between bump electrodes on different substrates.

The condition of each of the chips to be stacked or the formation of the penetrating electrode in a wafer condition must be tested. That is, it is necessary to check the continuity in the substrate between the bump electrode used for external connection and the penetrating electrode.

As for a short failure of the penetrating electrode, a proposal for an invention has been already made for a circuit that allows for detection of such a failure through ordinary surface wafer testing (refer, for example, to Japanese Patent Laid-Open No. 2008-96312, hereinafter as Patent Document 1)

SUMMARY OF THE INVENTION

However, the technique described in the above Patent Document 1 can detect only a short failure of the penetrating electrode. The technique is unable to test this penetrating electrode portion for open failure before package assembly.

As a result, a failure of this portion is found during the final test following the completion of the assembly. A loss of a large number of man-hours and raw materials including a plurality of wafers and assembly members has accounted for a large percentage of manufacturing cost.

It is a need for the present invention to provide a semiconductor device configured to allow for detection of short and open failures of penetrating electrodes in a chip or wafer condition. It is another need for the present invention to provide a penetrating electrode testing method for such detection.

A semiconductor device according to an embodiment of the present invention includes a semiconductor substrate, integrated circuit, penetrating electrode, bump electrode and test pad electrode.

The integrated circuit is formed on a first main surface (so-called front surface) of the semiconductor substrate.

The penetrating electrode penetrates the semiconductor substrate in the thickness direction and has its one end electrically connected to the integrated circuit.

The bump electrode is formed on a second main surface of the semiconductor substrate and is electrically connected to another end of the penetrating electrode.

The test pad electrode is formed on the second main surface of the semiconductor substrate and is electrically connected to the bump electrode.

The above configuration permits detection of an open failure of the penetrating electrode for the following reason.

That is, as its name implies, a penetrating electrode penetrates the semiconductor substrate in the thickness direction. This type of electrode is intended to bring out the terminal of the integrated circuit onto the surface (so-called rear surface) opposite to the substrate surface on which the circuit is formed. Alternatively, there is another type of penetrating electrode called a TSV (through silicon via) that is intended to transmit the source voltage or other voltage to an overlying layer. Of these types of penetrating electrodes, many are designed to bring out the terminal of the semiconductor integrated circuit from the rear surface.

In the present invention, a test pad electrode is provided on the rear surface (second main surface) to make a pass/fail determination of the connection in the substrate between the penetrating electrode and integrated circuit or the connection in the substrate on the side of the bump electrode. This makes it possible to test a penetrating electrode after forming an integrated circuit first and then forming the penetrating electrode from the rear surface of the substrate. At this time, the continuity test is conducted by passing a current through this route or applying a voltage thereto.

The present invention provides a semiconductor device configured to allow for detection a short or open failure of penetrating electrodes in a chip or wafer condition. The present invention makes it possible to propose a penetrating electrode testing method for such detection.

BRIEF DESCRIPTION OF THE DRAWINGS

FIGS. 3A to 3F are a process flow diagram shown by sectional views;

FIGS. 4A to 4G are a diagram illustrating a mounting process flow including testing using, as appropriate, sectional views; and FIGS. 5A to 5G are a diagram illustrating a mounting process flow of the comparative example using, as appropriate, sectional views.

DETAILED DESCRIPTION OF THE PREFERRED EMBODIMENT

An embodiment of the present invention will be described below in the following order with reference to the accompanying drawings:

1. Semiconductor device structure showing a penetrating electrode position in plan and sectional views
2. Example of forming a penetrating electrode
3. Mounting process including testing

1. Semiconductor Device Structure Showing Penetrating Electrode Position in Plan and Sectional Views FIG. 1 is a conceptual sectional view and plan view of a semiconductor device according to an embodiment of the present invention.

Figure 1:
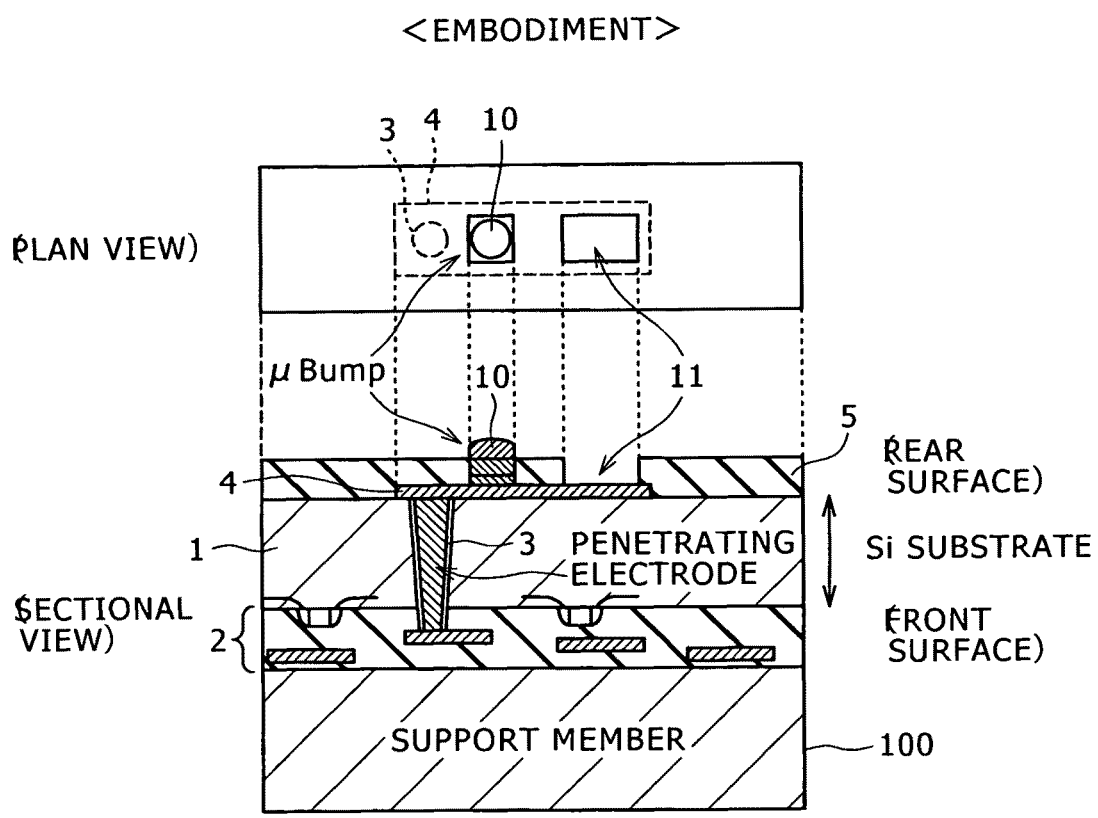
FIG. 1 is a conceptual sectional view and plan view of a semiconductor device according to an embodiment of the present invention.

As illustrated in FIG. 1, an integrated circuit 2 is formed on a first main surface (so-called front surface) of a silicon substrate 1 serving as a "semiconductor substrate." This surface is the bottom side shown in FIG. 1.

A penetrating electrode for a microbump is not allowed to have an excessively large diameter because its formation density must be relatively small. Therefore, it is necessary to form a silicon substrate 1 thin to a certain extent.

For this reason, a support substrate 100, for example, is attached to the surface of the integrated circuit 2 as a support member after the same circuit 2 has been formed on the front surface (bottom side in FIG. 1). FIG. 1 is a sectional view and rear plan view when the support substrate 100 is flipped around so that another surface (rear surface) of the silicon substrate 1 comes on top.

A penetrating electrode 3 is formed to penetrate the silicon substrate 1 roughly in the thickness direction. The bottom surface of the penetrating electrode 3 is in contact with a given internal wire of the integrated circuit 2, thus establishing electrical connection.

On the other hand, an electrode connection wire 4 is formed on the rear surface of the silicon substrate 1 so as to come in contact with the top surface of the penetrating electrode 3. The electrode connection wire 4 is formed from the rear surface by means of a wire formation technique of the wafer process.

Much of the top side of the electrode connection wire 4 and the rear surface of the silicon substrate 1 are coated with an insulating film 5 (or resin layer).

The insulating film 5 has openings in two locations, one where a microbump (μ Bump) electrode 10 is formed, and another where a test pad electrode is formed. The microbump electrode 10 is a mode of a "bump electrode" according to an embodiment of the present invention.

The present electrode structure is characterized in that the microbump electrode 10 and test pad electrode 11 are provided on the same surface (second main surface) of the silicon substrate 1 (semiconductor substrate).

So long as the microbump electrode 10 and test pad electrode 11 are provided on the same surface, the relative positional relationship therebetween is not limited to that illustrated in FIG. 1, but an arbitrary positional relationship may be selected.

For example, the microbump electrode 10 may be formed at one end of a single rectangular opening in the insulating film, and an opening region at another end thereof may be used for the test pad electrode 11. In this case, the opening region is formed to be wide enough for contact with a test probe.

Alternatively, if damage is not likely to occur due to pressing of a probe, the position of the test pad electrode 11 may be defined to be an area including the top surface of the portion with which the bottom surface of the penetrating electrode 3 comes in contact.

Still alternatively, although FIG. 1 illustrates the condition in which the microbump electrode 10 is already formed, the test itself is designed to check the penetrating electrode 3 for continuity (test the same electrode 3 for open or short failure). Therefore, this test may be performed prior to the formation of the microbump electrode 10. In this case, an opening may be formed in the test pad electrode 11 to include the area where the microbump electrode 10 will be formed.

It should be noted, however, that if surface roughness caused by pressing a probe is not desired, the test pad may be arranged so as not to overlap the microbump electrode 10. In this case, because the microbump electrode 10 has yet to be formed unlike the example shown in FIG. 1, test probing may be performed immediately beside the microbump electrode 10.

Further, it is not necessary to define the range of area of the test pad electrode 11 to be in an opening of the insulating film 5 covering the electrode connection wire 4. So long as the insulating film 5 has an area required for contact with a test probe, it is common that a microbump does not have such a wide area in the wire on the rear surface. Therefore, such a wide area may be considered a test pad region.

In the plan view of FIG. 1, on the other hand, the connection area of the penetrating electrode 3, the microbump electrode 10 and the test pad electrode 11 are arranged side by side. However, an arbitrary arrangement may also be selected.

In the embodiment shown in FIG. 1, a metal layer (electrode connection wire 4) is provided on the penetrating electrode 3 that appears on the rear surface. The metal layer has a dedicated test pad to perform testing from the rear surface at an area different from the position of the microbump electrode 10 that is conductively connected to a different wafer or substrate.

A practical rear surface wafer test must be performed with the support member (support substrate 100) left attached to the silicon substrate 1.

Figure 2:
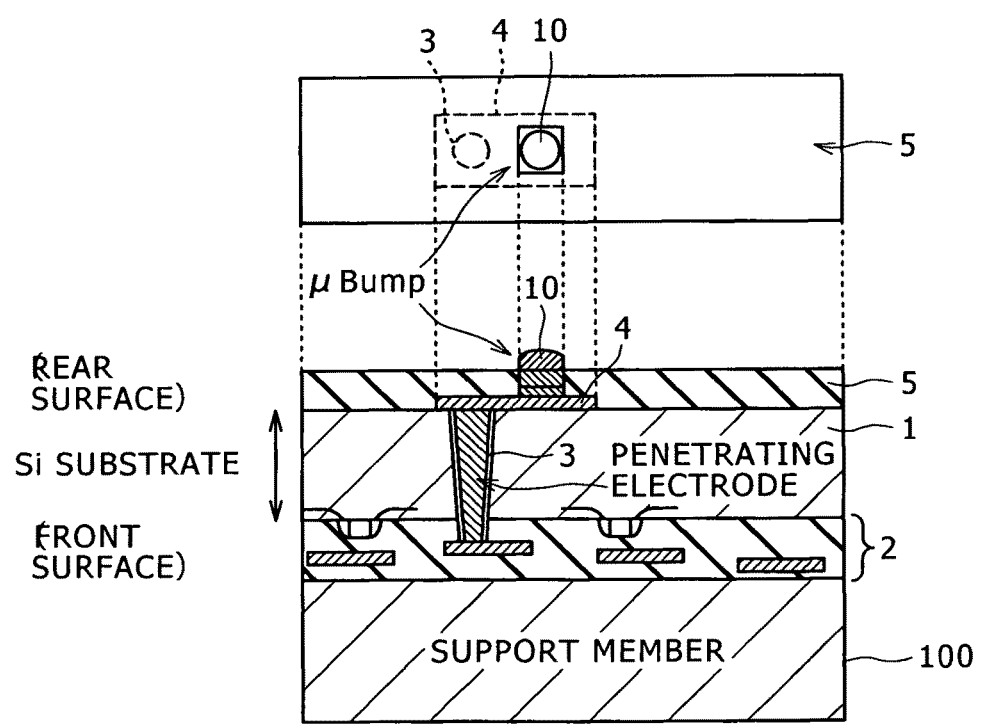
FIG. 2 is a rear sectional view and rear plan view of an ordinary semiconductor device not equipped with a rear surface test pad as a comparative example.

FIG. 2 illustrates a rear sectional view and rear plan view of an ordinary semiconductor device not equipped with a rear surface test pad as a comparative example.

An ordinary rear surface metal is used solely to shift the positions of the penetrating electrode 3 and microbump electrode 10. Therefore, a wide area (metal portion which will be useless if the embodiment of the present invention is not applied) as shown in FIG. 1 is not formed. As a result, the size and plane shape of the electrode connection wire 4 allows for distinction as to whether the embodiment of the present invention is applied.

Further, the comparison of the two figures shows that the test pad electrode 11 illustrated in FIG. 1 can be formed by extending the existing rear surface metal layer and etching the rear surface interlayer insulating film so as to expose the pad portion.

As described above, the electrode structure according to the embodiment of the present invention can be formed without entailing any significant increase in manufacturing cost.

It should be noted that the structures illustrated in FIG. 1 may be provided one for each of the microbump electrodes 10. Alternatively, the structures may be provided at a predetermined ratio for a number of the microbump electrodes 10. When provided at a predetermined ratio, the structures should preferably be provided regularly (e.g., periodically in the X and Y directions) so that they are not distributed in an unbalanced manner between different areas. It should be noted, however, that the microbump electrodes 10 that can electrically conduct via the integrated circuits 2 are often not arranged at periodic intervals because of the positional relationship with the terminals of the integrated circuits 2. In this case, the structures illustrated in FIG. 1 may be arranged at non-periodic intervals. On the other hand, the electrode connection wires 4 need not be equally shaped. Where the microbump electrodes 10 are densely arranged, only the same electrodes 10 in the surrounding area, for example, may have the structure illustrated in FIG. 1. Alternatively, thin wires running along spaces between the microbump electrodes 10 may be provided halfway along the routes of the electrode connection wires 4.

2. Example of Forming Penetrating Electrode

FIGS. 3A to 3F are a process flow diagram shown by sectional views. A magnified view of the area near the penetrating electrode on the rear surface is used as the flow diagram.

First, FIG. 3A illustrates the condition in which the penetrating electrode 3 has been formed to such an extent that the same electrode 3 appears on the rear surface. A deep hole is formed in the silicon substrate 1 during surface treatment. The inside of the hole is coated with a thin insulating film, and the hole is filled with a conductive material. FIG. 3A illustrates the condition in which the silicon substrate 1 has been shaved from the rear surface, for example, by the CMP process with the same substrate 1 supported by the support substrate 1 so that the bottom of this plug appears. Because the rear surface is also coated with a thin insulating film, only the top surface of the penetrating electrode 3 is exposed. The process flow prior to this stage is not shown.

FIG. 3B shown next illustrates the condition in which a pad metal wire (layer which will serve as the electrode connection wire 4) has been stacked on top.

FIG. 3C shown next illustrates the condition in which the pad metal wire has been worked on to form a connection portion of the microbump electrode 10 and a test pad portion serving as the test pad electrode 11 from the penetrating electrode 3, as a result of which the electrode connection wire 4, shown in FIG. 1, has been formed.

FIG. 3D illustrates the condition in which the insulating film 5 has been formed on top of the electrode connection wire 4. FIG. 3E illustrates the condition in which openings have been made in the insulating film 5 where the microbump electrode 10 and a test pad portion (test pad electrode 11) will be formed by applying a resist, exposing the resist and performing the RIE process.

FIG. 3F, a final figure, illustrates the condition in which a bump electrode has been formed by reflow after forming the microbump electrode 10 by using, for example, a resist adapted to open only the opening portion of the microbump electrode 10.

A practical rear surface wafer test may be performed before or after the formation of the microbump electrode 10. It should be noted, however, that if the test is conducted after the formation thereof, considerable caution must be exercised in the handling of the wafer so as not to cause any defect to the microbump electrode 10.

Further, it is preferred that the support member (support substrate 100) attached to the front surface should be roughly as thick as the thickness by which the silicon substrate whose thickness should be reduced is shaved during the rear surface wafer test. This eliminates the need for height adjustment of the probe tip of the tester used.

It should be noted that the pattern of the above rear surface test pad (electrode connection wire 4 including the test pad electrode 11) should preferably be the same as that of the front surface test pad. That is, test pad electrodes are provided in equal numbers on the front and rear surfaces (first and second main surfaces) with the semiconductor substrate sandwiched therebetween, and the shape and positions of the test pad electrodes should preferably be the same on the front and rear surfaces. Here, the front surface test pads are pad electrodes that are normally existing and used, for example, for circuit testing, process check and other purposes in a wafer condition.

The number (and positions and size) of the test pad electrodes 11 on the rear surface is matched to that of the test pad electrodes on the front surface used for other tests to ensure that a common probe card can be used on both the front and rear surfaces. A probe card requires high adjustment cost and other costs, is expensive and wears down. Therefore, the fact that a common probe card can be used on both the front and rear surfaces contributes to significant cost reduction.

It should be noted that the positions of only the test pad electrodes 11 in the chip must be matched on the front and rear surfaces. The shape of the electrode connection wire 4 need not be exactly the same on the front and rear surfaces.

If priority is given to matching the positions of the test pad electrodes 11, the occurrence of the test pad electrodes 11 (dummy electrodes) is allowed which are not used for testing purposes and are used only on one side of the front and rear surfaces. These test pad electrodes 11 are useless in terms of testing for which they are not used. However, the same electrodes 11 exist where there are originally no wires. Therefore, it cannot be said that these electrodes are useless. Further, the test pad electrodes 11 are formed by a single-step process, thus resulting in no increased cost. Rather, the above cost reduction achieved by the probe card is significant. Therefore, a substantial cost reduction can be accomplished as a whole.

Further, more cost reduction can be accomplished if a common mask can be used to form the test pads on the front and rear surfaces.

Further, although not specifically illustrated, test alignment marks are required to conduct a rear surface wafer test. Such marks may be included in a mask when the mask is prepared.

It should be noted that if a plurality of penetrating electrodes are provided on the semiconductor substrate, at least one test pad should preferably be connected to each of the two ends of all the penetrating electrodes.

3. Mounting Process Including Testing

FIGS. 4A to 4G are a diagram illustrating a mounting process flow including testing using, as appropriate, sectional views.

FIG. 4A illustrates a sectional view of a wafer after it has been finished. In this figure, the top surface is the front surface (first main surface). An integrated circuit is formed on the front surface, and a substrate body region is provided under (on the rear surface of) the integrated circuit. A simple DC test or process check is conducted during the wafer process. However, this process step is not illustrated.

In FIG. 4B, a wafer test (circuit test) is conducted. When the wafer passes the test, the wafer proceeds to the next rear surface process. The wafer is discarded if it fails the test. A certain degree of reduction in yield (Y-loss) occurs in this stage.

The rear surface treatment of the wafer shown in FIG. 4C is a process step up to the formation of the electrode connection wire 4 or microbump electrode 10. Although not described in detail because a description was already given earlier, there is a potential that a faulty connection of the penetrating electrode 3 may occur in this process step. The area enclosed by a dashed circle, for example, is where a connection failure may occur.

FIG. 4D is a flow diagram including probing test from the rear surface which can be introduced for the first time as a result of application of the embodiment of the present invention. In this test, a tester probe is brought into contact with the test pad electrode 11 shown, for example, in FIG. 1 using a probe card to simultaneously conduct a short failure test and connection failure test (open failure test). Here, in addition to an OK/NG test (pass/fail determination) adapted to determine whether a current flows between the plurality of test pad electrodes 11, other tests are also possible, including one adapted, for example, to test for increase in resistance when a given current is passed, and another adapted to test for circuit operation through the acceptable penetrating electrode 3 in some cases.

It should be noted, however, that connection failures cannot always be detected in all the penetrating electrodes 3. The test conducted here is basically performed via the integrated circuit 2. Therefore, the test is performed between the penetrating electrodes 3 through the paths in those circuits that can be electrically checked for continuity even in an inactive condition. Alternatively, if the plurality of penetrating electrodes 3 are connected to the electrode connection wire 4, the test can be conducted through the same wire 4. In this case, connection failures in the integrated circuits 2 and penetrating electrodes 3 cannot be detected.

In FIG. 4E, the wafer that has passed the test is detached from the test pad electrode 11 and diced into chips. The chips are stacked one on top of another in a three-dimensional manner, followed by a final test of an assembled product (FIG. 4G) for shipment.

As described above, as many as three tests are conducted in the illustrated process steps alone. The wafer test shown in FIG. 4B normally does not cause much of reduction in yield so long as the wafer process has a high level of perfection.

On the other hand, if the test shown in FIG. 4D that can be introduced by the embodiment of the present invention is not performed (refer to FIGS. 5A to 5G), it is not completely unlikely that the manufacturing cost may jump up. This will be explained next with reference to a comparative example.

4. Comparative Example

In FIGS. 5A to 5G, there is no rear surface wafer test shown in FIG. 4D. In the absence of the test pad electrode 11 as shown in FIG. 2, a rear surface test is impossible to perform.

The chips are assembled to their final form without connection failures manifesting themselves from the wafer test shown in FIG. 5B to the final test (FIG. 5G). In this case, even a single connection failure leads to discard of the finished product shown in FIG. 5F, possibly resulting in a significant reduction in yield (FIG. 5G).

The present invention allows for detection of connection failures of the penetrating electrode 3 and moreover permits detection of not only short failures but also open failures.

Hence, this test information provides information including distribution across the wafer, contributing to improved yield and above all preventing substantial increase in manufacturing cost (raw material and human cost).

The manufacturing process including test method described above can be summarized as follows:

(1) Form the integrated circuit 2 on the first main surface of the semiconductor substrate 1 and perform a circuit test (wafer test).

(2) Then, attach the support substrate 100 to the first main surface and form, from the second main surface, the plurality of penetrating electrodes 3 that are electrically connected to the integrated circuit 2.

(3) Form, on the second main surface, the plurality of test pad electrodes 11 that are electrically connected to the penetrating electrodes 3 via the electrode connection wire 4.

(4) Test the penetrating electrodes in this condition. More specifically, bring the test probes in contact with the plurality of formed test pad electrodes to pass a current through a path extending from the electrode-to-electrode wire, to the penetrating electrode, to the integrated circuit, to other penetrating electrode and to other electrode-to-electrode wire. This makes it possible to perform a continuity test between the penetrating electrode and integrated circuit and between the penetrating electrode and electrode-to-electrode wire.

It should be noted that a current must be passed particularly through the path described in (4). Therefore, the testable penetrating electrode 3 has certain restrictions. It should be noted, however, that the structure of the penetrating electrode and rear surface test pad according to the present embodiment allows a previously impossible test to be performed, thus contributing to significantly improved yield and substantial cost reduction.

It should be noted that the penetrating electrode test shown in FIG. 4D is conducted in a wafer condition in the above description. However, the penetrating electrode test may be performed in a chip condition so long as there is no interfere with ease of handling.

The present application contains subject matter related to that disclosed in Japanese Priority Patent Application JP 2010-035350 filed with the Japan Patent Office on Feb. 19, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A penetrating electrode test method comprising:
   a step (a) of performing a circuit test on a wafer, said wafer including an integrated circuit in physical contact with a semiconductor substrate;
   a step (b) of extending a penetrating electrode through said semiconductor substrate from a surface of the semiconductor substrate, said penetrating electrode terminating at said integrated circuit;
   a step (c) of forming an electrode connection wire on said surface of the semiconductor substrate, said penetrating electrode being in physical contact with said electrode connection wire;
   a step (d) of bringing a test probe into physical contact with a test pad region of the electrode connection wire to perform a connection failure test, said integrated circuit being between said semiconductor substrate and a support substrate during the step (d).

2. The method of claim 1, further comprising:
   a step of detaching said support substrate from said integrated circuit after the step (d).

3. The method of claim 1, wherein said semiconductor substrate is a silicon substrate.

4. The method of claim 1, wherein said electrode connection wire is a metal layer.

5. The method of claim 1, wherein an insulating film electrically isolates said electrode connection wire from said semiconductor substrate.

6. The method of claim 1, wherein said connection failure test electrically connects said test probe to said integrated circuit.

7. The method of claim 1, wherein said connection failure test evaluates electrical conductivity between said electrode connection wire and said integrated circuit.

8. The method of claim 1, further comprising:
a step of forming a resin film on said electrode connection wire, an opening through the resin film exposing said test pad region of the electrode connection wire.

9. The method of claim 8, wherein said electrode connection wire is between said resin film and said surface of the semiconductor substrate.

10. The method of claim 8, further comprising:
a step of forming a bump electrode on said electrode connection wire, said electrode connection wire being electrically connected to said bump electrode.

11. The method of claim 10, wherein the step of forming the bump electrode is performed prior to the step (d).

12. The method of claim 10, wherein said bump electrode is within said opening.

13. The method of claim 10, wherein in a plan view, said bump electrode is between said penetrating electrode and said test pad region of the electrode connection wire.

14. The method of claim 10, wherein said bump electrode is between a connection portion of the electrode connection wire and said test pad region of the electrode connection wire.

15. The method of claim 14, wherein said penetrating electrode is in physical contact with said connection portion of the electrode connection wire.

16. The method of claim 1, wherein the steps (b)-(d) are performed only after said wafer has passed said circuit test.

17. The method of claim 1, wherein said wafer passes said connection failure test when said connection failure test detects an absence of a short or open between said integrated circuit and said test pad region of the electrode connection wire.

18. The method of claim 1, further comprising:
a step of dicing said wafer into chips only after said wafer has passed said connection failure test.

19. The method of claim 18, further comprising:
a step of forming an assembled product by stacking one of the chips onto another of the chips.

20. The method of claim 19, further comprising:
a step of performing a final test of the assembled product.

* * * * *